United States Patent
Cho et al.

(10) Patent No.: US 6,732,750 B2
(45) Date of Patent: May 11, 2004

(54) SEMICONDUCTOR WAFER CLEANING APPARATUS AND METHOD OF USING THE SAME

(75) Inventors: Yong-joon Cho, Seoul (KR); Seung-kun Lee, Suwon (KR); Young-hwan Yun, Seoul (KR); Gyu-hwan Kwag, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 367 days.

(21) Appl. No.: 09/832,330

(22) Filed: Apr. 11, 2001

(65) Prior Publication Data

US 2001/0045223 A1 Nov. 29, 2001

(30) Foreign Application Priority Data

Apr. 11, 2000 (KR) .......................................... 2000-18900
Feb. 13, 2001 (KR) .......................................... 2001-6986

(51) Int. Cl.$^7$ ................................................ B08B 3/00
(52) U.S. Cl. .................... 134/61; 134/902; 134/95.2; 134/135; 134/137; 134/153
(58) Field of Search .............................. 134/902, 95.2, 134/61, 135, 137, 153, 200, 76, 62, 26, 31, 32, 25.4, 30; 34/443, 444, 449; 211/41.17, 41.18; 414/935, 936, 941

(56) References Cited

U.S. PATENT DOCUMENTS

| | | | | |
|---|---|---|---|---|
| 5,569,330 A | * | 10/1996 | Schild et al. | ................... 134/1 |
| 5,678,320 A | * | 10/1997 | Thompson et al. | ............ 34/58 |
| 5,954,068 A | * | 9/1999 | Weber et al. | ............... 134/25.4 |
| 6,138,695 A | * | 10/2000 | Shibao et al. | .................. 134/61 |
| 6,447,232 B1 | * | 9/2002 | Davis et al. | ............. 414/217.1 |

FOREIGN PATENT DOCUMENTS

| | | | | |
|---|---|---|---|---|
| DE | 4413077 A1 | * | 10/1995 | ............. B08B/3/08 |
| DE | 19546990 A1 | * | 7/1996 | ............. B05C/3/00 |
| DE | WO 00/02234 | | 1/2000 | |
| EP | 801814 B1 | * | 8/2001 | ............. B05C/3/00 |
| WO | P1999-006968 | | 6/1998 | |

* cited by examiner

Primary Examiner—Alexander Markoff
(74) Attorney, Agent, or Firm—Volentine Francos, PLLC

(57) ABSTRACT

A semiconductor wafer cleaning apparatus and method uses only one inner bath for chemical solution and de-ionized water cleaning, and includes a marangoni dryer for cleaning and drying semiconductor wafers. The apparatus includes a loading unit loaded with a cassette holding wafers; a moving mechanism for extracting the wafers from the cassette and moving the wafers into a loader; an inner bath for cleaning the wafers with a chemical solution or de-ionized water; a marangoni dryer including a hood, for moving the wafers from the loader into the bath, to be sealed to the bath; and a knife for supporting the wafers loaded into the bath at a lower portion thereof and moving the wafers up and down. Since the marangoni dryer is adhered to the bath during drying, the wafers are not affected by laminar flow or exhaustion and water marks do not occur thereon.

11 Claims, 8 Drawing Sheets

SEMICONDUCTOR WAFER CLEANING APPARATUS AND METHOD OF USING THE SAME

The present application claims priority under 35 U.S.C. §119 to Korean Application No. 2000-18900 and Korean Application No. 2001-6986 filed respectively on Apr. 11, 2000 and Feb. 13, 2001, which are hereby incorporated by reference in their entirety for all purposes.

BACKGROUND OF THE INVENTION

1. Field of the Invention

The present invention relates to a semiconductor wafer cleaning apparatus and method of cleaning semiconductor wafers using the same, and more particularly, to a semiconductor wafer cleaning apparatus employing a marangoni dryer and a method of cleaning semiconductor wafers using the same.

2. Description of the Related Art

A process for cleaning a semiconductor wafer is necessary to remove residual chemicals, small particles, and contaminants produced during the manufacture of integrated circuits. In particular, a cleaning process for removing fine contaminants attached to the surface of a semiconductor wafer is very important when highly-integrated circuits are fabricated.

Semiconductor wafer cleaning techniques include a chemical solution treatment process, a de-ionized water cleaning process, and a drying process. The chemical solution treatment process is a process for treating a semiconductor wafer with a chemical solution, and the washing process is a process for washing the semiconductor wafer treated with the chemical solution, with de-ionized water, and the drying process is a process for drying the washed semiconductor wafer. Among these processes, since defects caused by shortcomings in the drying process have a larger size and repeatedly occur in a pattern, integrated circuits may malfunction or function poorly.

As integrated circuits become more complicated, a conventional spin dryer using centrifugal force in the drying process reaches limits in its performance, so an IPA vapor dryer using isopropyl alcohol (IPA) has been suggested. However, when an IPA vapor dryer is used, water marks occur on the semiconductor wafer after drying.

In order to avoid this problem, a marangoni dryer for drying a wafer without exposing it to the air, after a chemical solution treatment process and de-ionized water cleaning process, has been suggested. While the marangoni dryer lifts the semiconductor wafer from a bath filled with de-ionized water, or slowly drains the de-ionized water from the bath, it removes the de-ionized water using a difference in surface tension between the IPA and the de-ionized water, by spraying IPA onto the surface of the semiconductor wafer. The marangoni dryer can remove the de-ionized water by using an amount of IPA as small as 1/10 of the amount of IPA used by the IPA vapor dryer. However, since the marangoni dryer is easily affected by laminar flow or exhaustion in a semiconductor wafer cleaning apparatus, drying is not uniformly performed over the surface of the semiconductor wafer, thereby forming water marks. In particular, water marks non-uniformly occur when a semiconductor wafer having a large diameter of 12 inches is used.

SUMMARY OF THE INVENTION

The present invention is therefore directed to a semiconductor wafer cleaning apparatus and method which substantially overcome one or more of the problems due to the limitations and disadvantages of the related art.

To solve the above problems, it is a first object of the present invention to provide a semiconductor wafer cleaning apparatus which is not affected by an atmosphere and is capable of preventing water marks when a marangoni dryer is used.

It is a second object of the present invention to provide a method for cleaning a semiconductor wafer in which water marks are prevented by properly using a semiconductor wafer cleaning apparatus according to the present invention.

Accordingly, to achieve the first and other objects, there is provided a semiconductor wafer cleaning apparatus. The semiconductor wafer cleaning apparatus includes only one inner bath for performing both chemical solution cleaning and de-ionized water cleaning therein. Also, the semiconductor wafer cleaning apparatus includes a marangoni dryer for both cleaning and drying semiconductor wafers therein. The semiconductor wafer cleaning apparatus includes a loading unit loaded with a cassette on which a plurality of semiconductor wafers are mounted; a moving mechanism for extracting the semiconductor wafers mounted on the cassette of the loading unit and moving the extracted semiconductor wafers into a loader spaced apart from the loading unit; an inner bath spaced apart from the loader, for cleaning the semiconductor wafers with a chemical solution or de-ionized water; a marangoni dryer including a hood for moving the semiconductor wafers from the loader into the inner bath, capable of moving in the ±X-, ±Y-, and ±Z-directions to be tightly sealed to the inner bath; and a knife for supporting the semiconductor wafers loaded into the inner bath, at a lower portion of the inner bath, and moving the semiconductor wafers up and down at a certain speed.

In detail, the marangoni dryer includes slots and a locking unit for mounting the semiconductor wafers mounted on the loader, a hood for drying the semiconductor wafers, an isopropyl alcohol (IPA) supply plate having a plurality of holes so that IPA is uniformly spread onto mounted semiconductor wafers in the hood, and an IPA supply nozzle installed on the IPA supply plate. Accordingly, the marangoni dryer moved in the ±X-, ±Y-, and ±Z-directions is closely adhered to the inner bath, and the semiconductor wafers after cleaning are dried, thereby preventing the marangoni dryer from being affected by laminar flow or exhaustion in the semiconductor wafer cleaning apparatus and preventing water marks from occurring on the surface of the semiconductor wafers.

Recessed portions are installed at both sidewalls of the inner bath, and outer baths are further installed at both sides of the inner bath, covering the recess portions. An exhaust line for uniformly performing exhaustion is further installed at both rear walls of the outer baths. Further, exhaustion is uniformly performed in a case where an exhaust line is installed at the outer baths installed at both sides of the inner bath during drying of the semiconductor wafers, thereby further reducing the occurrence of water marks on the surface of the semiconductor wafers.

In order to achieve the second and other objects, there is provided a method for cleaning a semiconductor wafer. The method includes the steps of loading a cassette on which a plurality of semiconductor wafers are mounted, into a loading unit; extracting the semiconductor wafers mounted on the cassette of the loading unit and moving the extracted semiconductor wafers into a loader spaced apart from the loading unit. The above-mentioned steps are followed by the steps of mounting the semiconductor wafers moved into the loader, into a marangoni dryer; moving the marangoni dryer on which the semiconductor wafers are mounted, into an inner bath spaced apart from the loader; moving the semiconductor wafers from the marangoni dryer into an inner bath and cleaning the semiconductor wafers with a chemical solution and/or de-ionized water.

Subsequently included in the method are the steps of lowering the marangoni dryer to be closely adhered to the inner bath; and lifting the semiconductor wafers at a certain speed from the inner bath containing the de-ionized water, or slowly draining the de-ionized water while nitrogen and IPA fumes are sprayed from the top of the marangoni dryer, so that the chemical solution and/or de-ionized water is removed from the semiconductor wafers using a difference in surface tension between the IPA and the de-ionized water.

If the semiconductor wafers cleaned with the de-ionized water are dried in a state where the marangoni dryer is closely adhered to the bath, the marangoni dryer may be not affected by laminar flow or exhaustion in the semiconductor wafer cleaning apparatus, thereby reducing the occurrence of water marks on the surface of the semiconductor wafers. Finally, exhaustion is uniformly performed by an exhaust line installed at the outer baths installed at both sides of the inner bath during removal of the de-ionized water, thereby further reducing the occurrence of water marks on the surface of the semiconductor wafers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
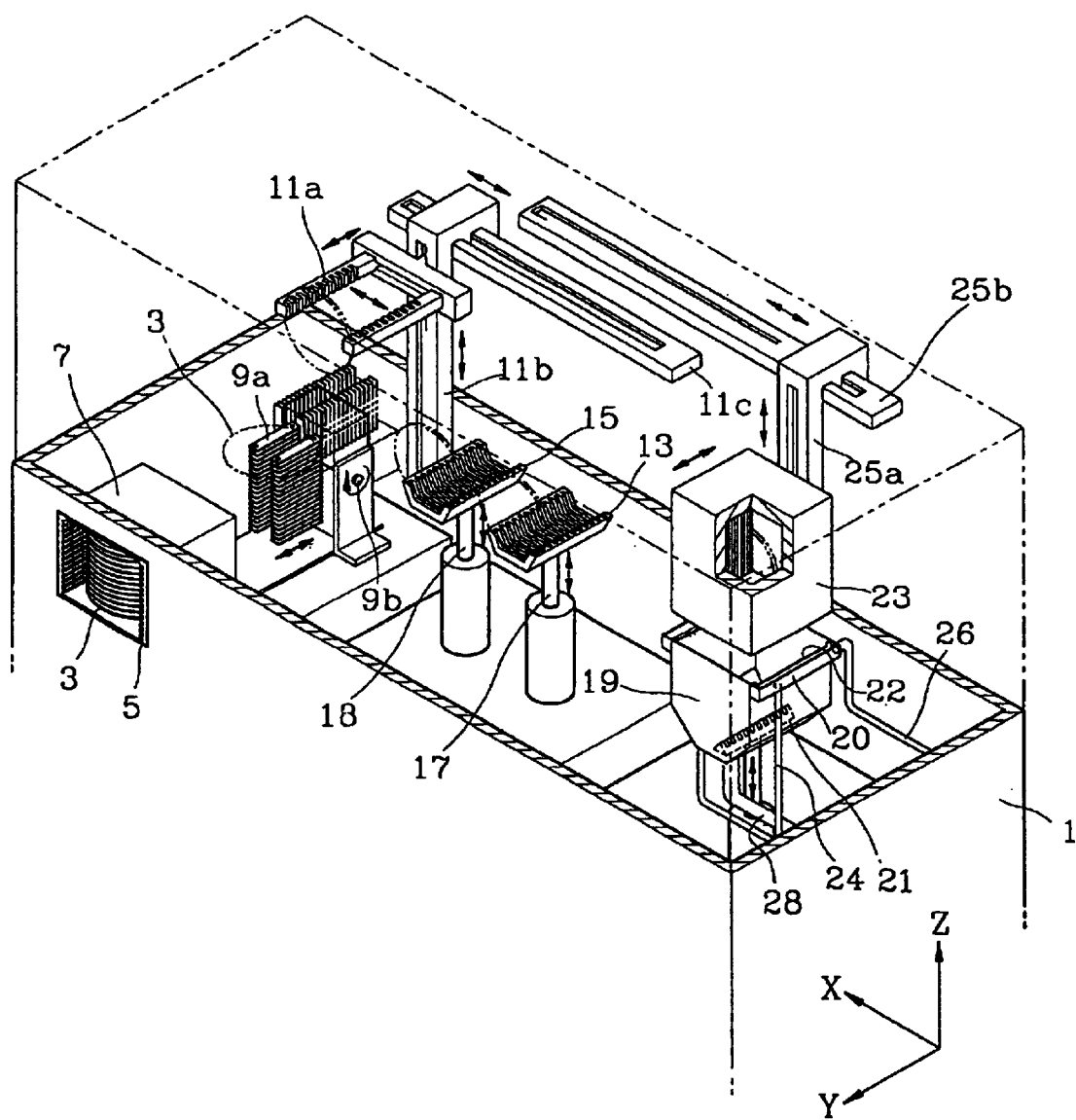
FIG. 1 is a schematic perspective view of a semiconductor wafer cleaning apparatus including a marangoni dryer according to a preferred embodiment of the present invention.
Figure 2:
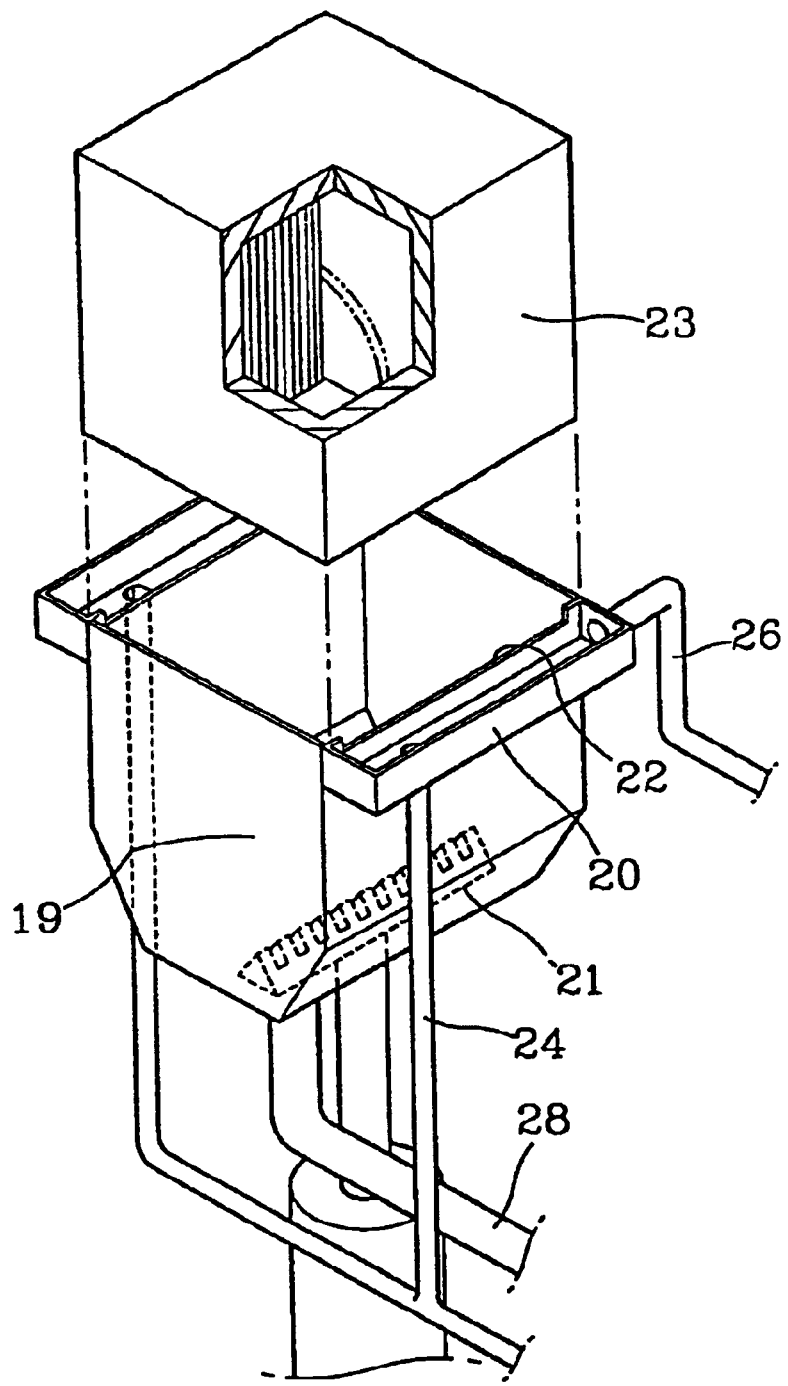
FIG. 2 is an enlarged view of an inner bath and an outer bath of FIG. 1.
Figure 3:
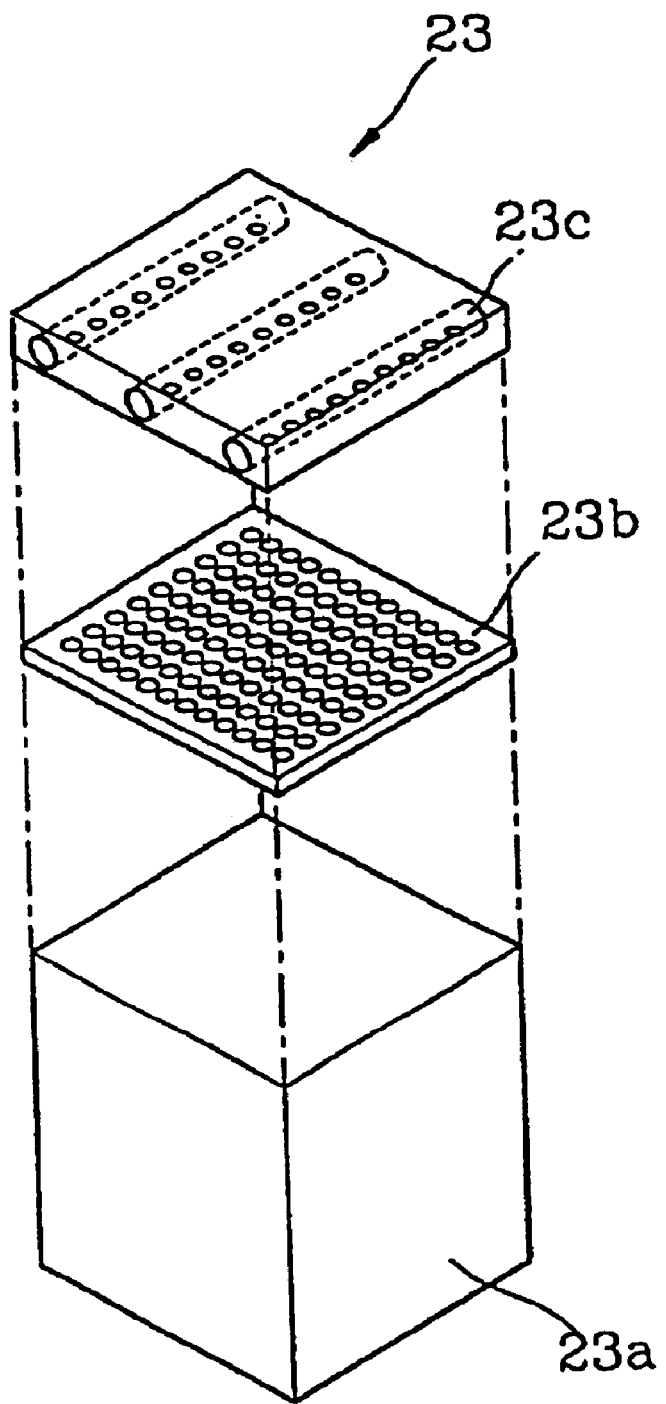
FIG. 3 is an exploded perspective view of the marangoni dryer of FIG. 1.

FIG. 1 is a schematic perspective view of a semiconductor wafer cleaning apparatus including a marangoni dryer according to the present invention, and FIG. 2 is an enlarged view of an inner bath and an outer bath of FIG. 1, and FIG. 3 is an exploded perspective view of the marangoni dryer of FIG. 1. Specifically, the semiconductor wafer cleaning apparatus includes only one inner bath for performing chemical solution cleaning and de-ionized water cleaning therein. A cassette is not used in cleaning semiconductor wafers and, the semiconductor wafers are not exposed to the air. Also, the semiconductor wafer cleaning apparatus includes a marangoni dryer for both cleaning and drying of the semiconductor wafers.

More specifically, the semiconductor wafer cleaning apparatus includes a loading unit 7 for loading a cassette 5 in which a plurality of semiconductor wafers 3, for example 13 semiconductor wafers having a large diameter of 12 inches, are mounted, or for loading an empty cassette, onto an upper part of a body 1. Also, the apparatus includes first moving mechanism 9a and 9b capable of moving in the ±Y-direction (back and forth), extracting the plurality of the semiconductor wafers 3 mounted on the cassette 5, and rotating the semiconductor wafers 3 so that they are elevated in the Z-direction (upward). That is, the first moving mechanism 9a and 9b includes a pad 9a for extracting the plurality of semiconductor wafers 3 from the cassette 5, and a revolving body 9b for rotating the plurality of semiconductor wafers 3 mounted on the pad 9a so that they are elevated in the Z-direction (upward).

Also, the apparatus includes second moving mechanism 11a through 11c for moving the semiconductor wafers 3 rotated upward by the first moving mechanism 9a and 9b, into a loader 13 or an unloader 15. The second moving mechanism 11a through 11c includes a clutch 11a for picking-up the semiconductor wafers 3 rotated upward by the first moving mechanism 9a and 9b, and first and second rails 11b and 11c capable of enabling movement of clutch 11a in the ±X-, ±Y-, and ±Z-directions, for moving the semiconductor wafers 3 picked-up by the clutch 11a into the loader 13. For example, clutch 11a is movable in the ±Z-direction along the slot provided in first rail 11b. Also, rail 11b is movable in the ±X-direction along the slot provided in second rail 11c. However it is to be understood that in FIG. 1, the movement of the first rail 11b in the ±Y-direction is not shown for simplicity. It is also to be understood that the driving mechanisms for the clutch and rails of the second moving mechanism 11a through 11c are not shown for simplicity, but may be of any conventional type as would be known to one of ordinary skill.

The loader 13 holds the semiconductor wafers 3 before they are cleaned, and the unloader 15 holds the semiconductor wafers 3 after they are cleaned. Thus, the semiconductor wafers 3 arranged on the unloader 15 by the second moving mechanism 11a through 11c and the first moving mechanism 9a and 9b can be moved into an empty cassette of the loading unit 7. Also, the apparatus includes a first pusher 17 and a second pusher 18 installed under the loader 13 and the unloader 15, for moving the mounted semiconductor wafers 3 up and down (in the ±Z-direction) so that a marangoni dryer 23 picks up the semiconductor wafers 3.

Also, the apparatus includes an inner bath 19 spaced apart from the loader 13, for cleaning the semiconductor wafers 3 with a chemical solution or de-ionized water, a knife 21 for supporting the semiconductor wafers 3 loaded into the inner bath 19 at a lower portion of the inner bath 19 and moving the semiconductor wafers 3 up and down at a certain speed, and a supply line 28 for supplying de-ionized water or a chemical solution to the inner bath 19.

As shown in FIG. 2, outer baths 20 are connected to both sides of the inner bath 19, and recess portions 22 are formed on both sidewalls of the inner bath 19 so that the de-ionized water or chemical solution in the inner bath 19 can overflow into the outer baths 20. That is, the outer baths 20 are installed to cooperate or be aligned with recess portions 22 of the inner bath 19. A drain line 24 for draining the de-ionized water or chemical solution is connected to the bottom of the outer baths 20. The de-ionized water or chemical solution overflowing from the inner bath 19 flows into a storage tank (not shown) via the drain line 24. An exhaust line 26 for exhausting fumes of the chemical solution or IPA fumes is connected to both rear walls of the outer baths 20. The exhaust line 26 is formed on both rear walls of the outer baths 20 so as to uniformly exhaust IPA fumes during drying.

Also, the apparatus includes the marangoni dryer 23 for moving the semiconductor wafers 3 moved into the loader 13, into the inner bath 19 and drying the cleaned semiconductor wafers 3. As shown in FIG. 3, the marangoni dryer 23 includes a hood 23a including slots (inside of hatching of FIG. 1) and a locking unit (27 of FIGS. 4 through 10) for mounting the semiconductor wafers 3 mounted on the loader 13. For drying the semiconductor wafers 3, an isopropyl alcohol (IPA) supply plate 23b having a plurality of holes is included in the hood 23a, so that IPA is uniformly spread onto the semiconductor wafers in the hood 23a. Also, an IPA supply nozzle 23c is installed on the IPA supply plate 23b. Although not illustrated in the figures, hood 23a of the marangoni dryer 23 is actually open at the top, and IPA supply nozzle 23c and IPA supply plate 23b are stacked above the open hood 23a. Also, although not shown for simplicity, pipes are connected to IPA supply nozzle 23c to provide IPA.

In particular, the marangoni dryer 23 of the semiconductor wafer cleaning apparatus can improve the uniformity of drying of the semiconductor wafers 3 as the IPA supply nozzle 23c is installed on the middle and right and left sides of the marangoni dryer 23 and IPA fumes are sprayed to the entire hood 23a. The marangoni dryer 23 is connected to third moving mechanism 25a and 25b to be movable in the ±X-, ±Y-, and ±Z-directions. That is, the third moving mechanism 25a and 25b includes a third rail 25a along which the marangoni dryer 23 is movable in the ±Z-direction and a fourth rail 25b along which the marangoni dryer 23 is movable in the ±X-direction. As previously noted, the movement of the marangoni dryer 23 in the ±Y-direction is not shown in FIG. 1 for simplicity.

Further, the marangoni dryer 23 of the semiconductor wafer cleaning apparatus can be moved in the ±Z-direction (up and down). If the marangoni dryer 23 is moved in the −Z-direction, the marangoni dryer 23 can be closely adhered to the inner bath 19 during drying of semiconductor wafers, thereby preventing vortex flow and loss of IPA vapor supplied into the marangoni dryer, caused by laminar flow or exhaustion in the semiconductor wafer cleaning apparatus. As a result, the semiconductor wafers 3 are dried more uniformly, thereby preventing water marks. Further, exhaustion can be more uniformly performed via an exhaust line 26 installed in the outer baths 20 during drying of the semiconductor wafers 3, thereby further reducing the occurrence of water marks occurring on the surface of the semiconductor wafers 3.

In FIGS. 1 and 2, isopropyl alcohol (IPA) is supplied to the hood 23a by a bubbling method, but this is not shown for simplicity. In FIGS. 1 and 2, only one inner bath 19 and outer baths 20 are shown for simplicity, but the semiconductor wafer cleaning apparatus may include a plurality of inner baths and outer baths, in which both cleaning and drying of the semiconductor wafers 3 can be performed as described above.

Figure 8:
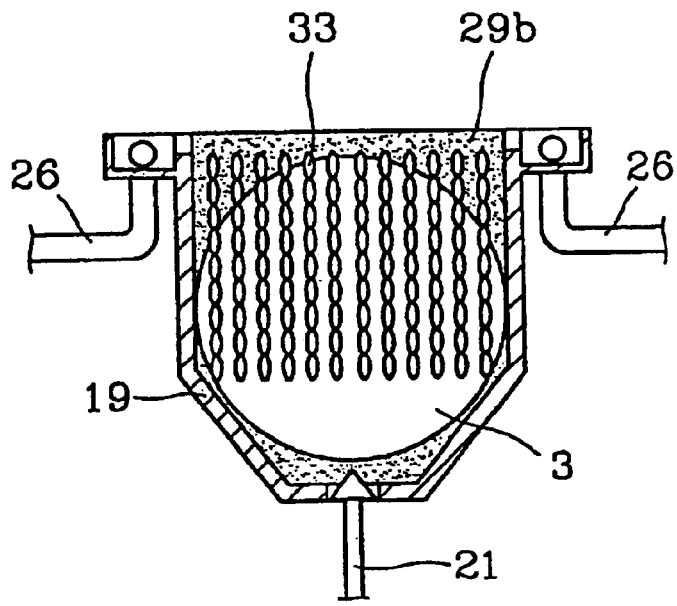
Figure 9:
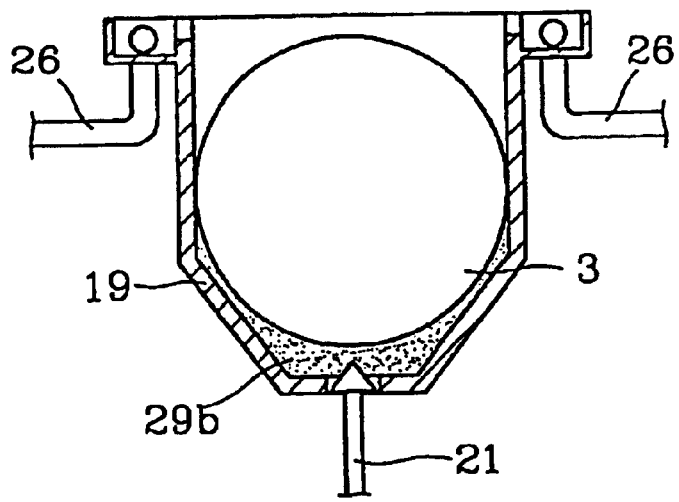
Figure 10:
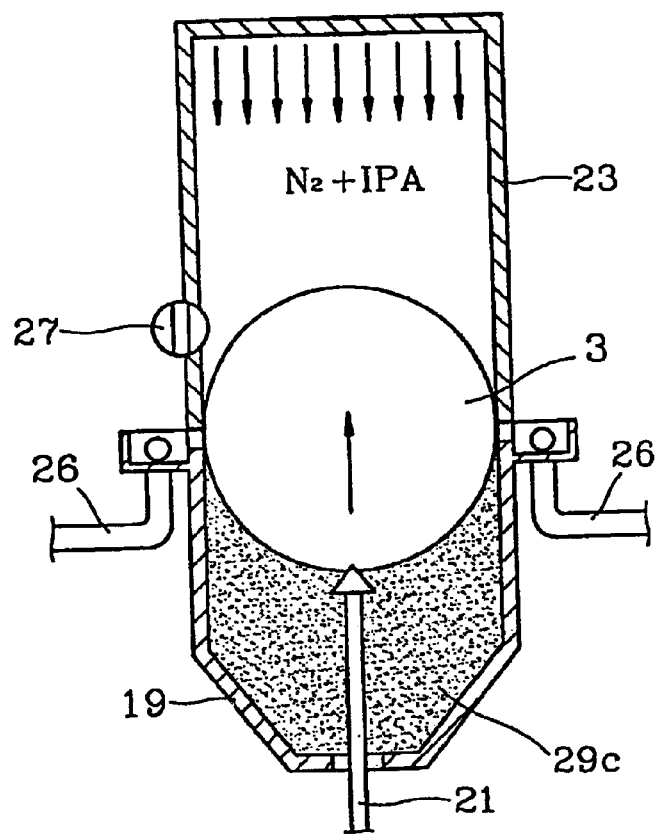
Figure 11:
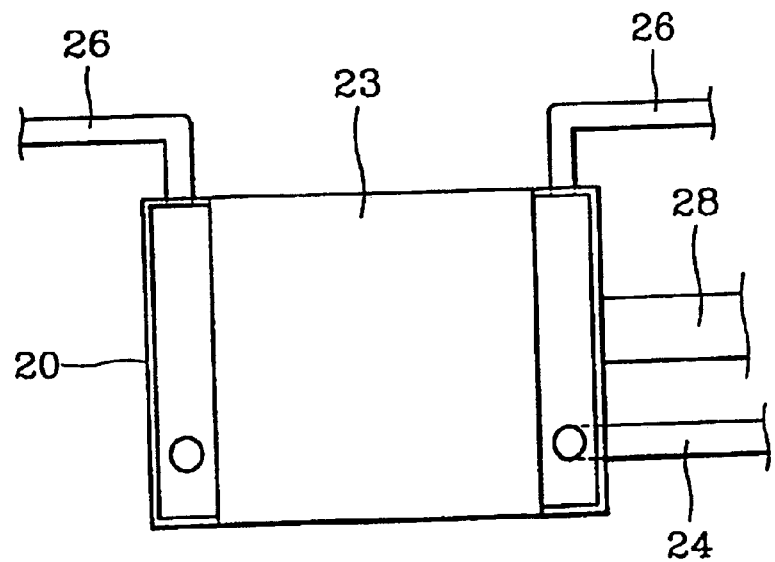
FIG. 11 is a plan view illustrating the step of cleaning semiconductor wafer of FIG. 10.

FIGS. 4 through 10 are schematic sectional views illustrating steps of cleaning semiconductor wafers using the semiconductor wafer cleaning apparatus of FIG. 1, and FIG. 11 is a plan view illustrating the step of cleaning the semiconductor wafer of FIG. 10. The same reference numerals used in FIGS. 1 through 3 are used to refer to the same elements in FIGS. 4 through 11.

Figure 4:
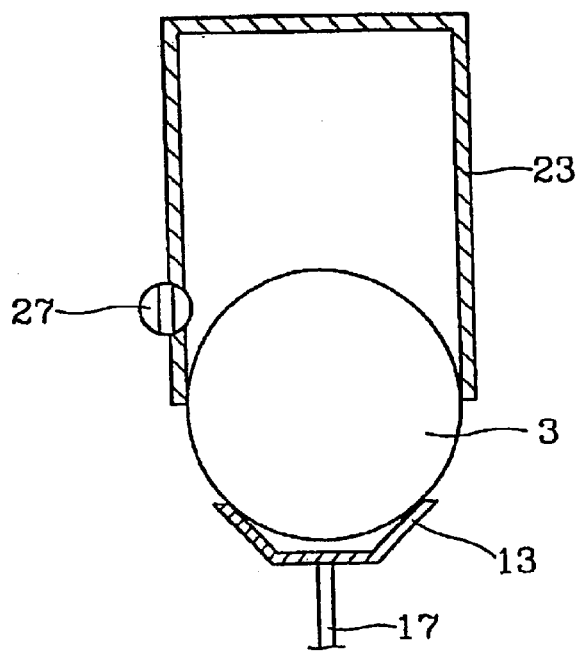
FIGS. 4 through 10 are schematic sectional views illustrating steps of cleaning semiconductor wafers using the semiconductor wafer cleaning apparatus of FIG. 1.

First, as shown in FIG. 4, semiconductor wafers 3 are extracted from a cassette 5 of a loading unit 7 and arranged on a loader 13. Subsequently, the semiconductor wafers 3 arranged on the loader 13 are lifted to a hood 23a of a marangoni dryer 23 located above the loader 13, using a first pusher 17. Here, a locking unit 27 of the hood 23a is unlocked (in a vertical direction) so that the semiconductor wafers 3 are moved into the hood 23a.

Figure 5:
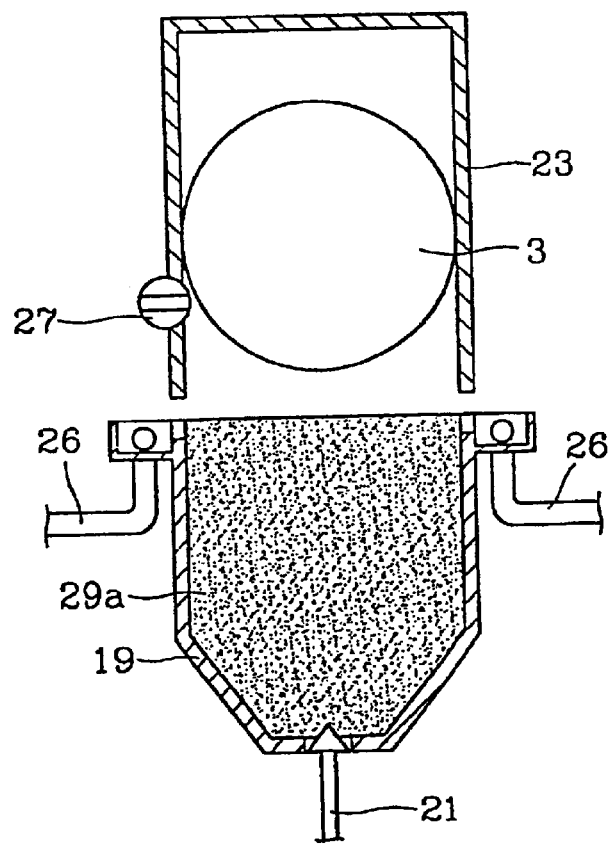

Next, as shown in FIG. 5, if the semiconductor wafers 3 are loaded into the hood 23a, the locking unit 27 is locked (in a horizontal direction) so that the semiconductor wafers 3 do not move downward. Next, the marangoni dryer 23 into which the semiconductor wafers 3 are loaded is moved above an inner bath 19 containing de-ionized water 29a, using a fourth rail 25b.

Figure 6:
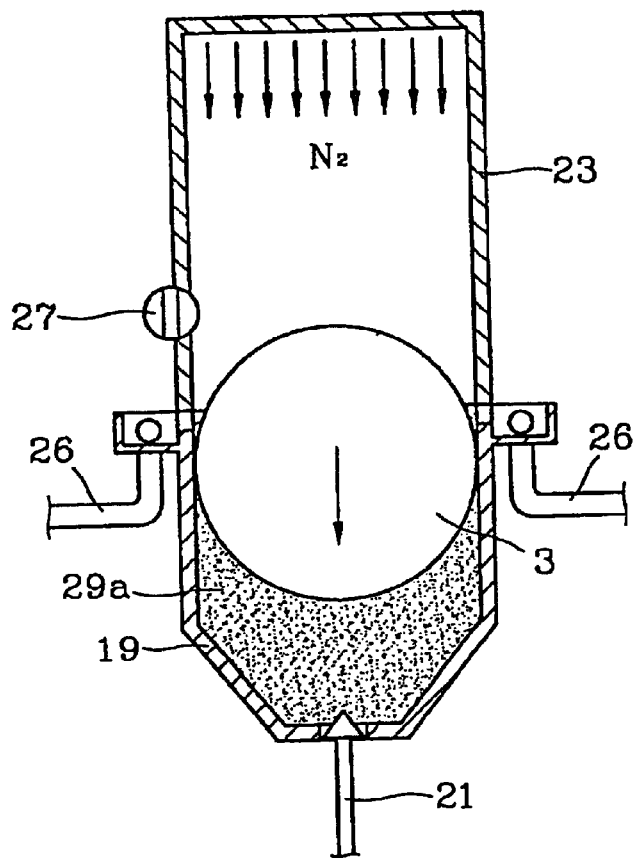

Subsequently, as shown in FIG. 6, the locking unit 27 in the hood 23a of the marangoni dryer 23 positioned above the inner bath 19 is unlocked, and the semiconductor wafers 3 fall into the inner bath 19 containing the de-ionized water 29a and are cleaned with the de-ionized water 29a. Here, nitrogen gas ($N_2$) is sprayed from the top of the marangoni dryer 23. The nitrogen gas is provided to the marangoni dryer 23 through pipes (not shown) connected through the open top of hood 23a to IPA supply nozzle 23c and through IPA supply plate 23c.

Figure 7:
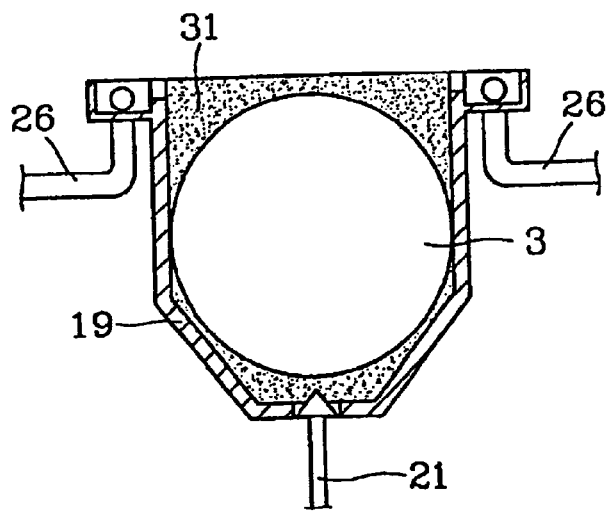

Next, after the de-ionized water 29a of FIG. 5 is drained, as shown in FIG. 7, the inner bath 19 is filled with a chemical solution 31, and the semiconductor wafers 3 are treated with the chemical solution 31. That is, the semiconductor wafers 3 are cleaned with the chemical solution 31.

Subsequently, as shown in FIG. 8, after the chemical solution 31 is drained, the inner bath 19 containing the semiconductor wafers 3 is again filled with de-ionized water 29b. Next, chemical materials are removed from the surface of the semiconductor wafers 3 by applying a megasonic apparatus to the inner bath 19 filled with the de-ionized water 29b. In FIG. 8, reference numeral 33 denotes bubbles created when the megasonic apparatus is used.

Next, as shown in FIG. 9, the de-ionized water 29b is quickly drained from the inner bath 19 in which the cleaned semiconductor wafers 3 are loaded, thereby quickly removing chemical materials from the surface of the semiconductor wafers 3 and from the inner bath 19.

Next, as shown in FIG. 10, the inner bath 19 from which the de-ionized water 29b has been drained is again filled with de-ionized water 29c. Subsequently, the marangoni dryer 23 is moved in the −Z-direction (downwards) and closely adhered to the inner bath 19. That is, the marangoni dryer 23 of FIG. 2 is closely adhered or sealed to the inner bath 19. Thus, as mentioned above, the marangoni dryer 23 is not affected by laminar flow or exhaustion in the semiconductor wafer cleaning apparatus during drying of the semiconductor wafers.

Subsequently, as shown in FIGS. 10 and 11, while nitrogen gas ($N_2$) and IPA fumes are sprayed from the top of the marangoni dryer 23, the locking unit 27 of the marangoni dryer 23 is unlocked, and the semiconductor wafers 3 are slowly moved from the inner bath 19 to the marangoni dryer 23 by a knife 21 which is movable in the ±Z-direction, thereby removing the de-ionized water using a difference in surface tension between the IPA and the de-ionized water.

Here, since the inner bath 19 is closely adhered to the marangoni dryer 23, vortex flow and loss of IPA vapor supplied into the marangoni dryer, caused by laminar flow or exhaustion in the semiconductor wafer cleaning apparatus, can be prevented, thereby preventing water marks from occurring on the semiconductor wafers 3. Further, as mentioned above, since exhaustion is uniformly performed from both sides of the inner bath 19, the occurrence of water marks on the semiconductor wafers 3 can be further reduced without being affected by laminar flow or exhaustion in the semiconductor wafer cleaning apparatus. In an embodiment of the invention, the semiconductor wafers 3 are dried while slowly moving them from the inner bath 19 into the marangoni dryer 23. However, the semiconductor wafers 3 may alternatively be dried while slowly draining the de-ionized water 29c from inner bath 19 via a drain line (not shown) coupled to a lower portion of inner bath 19.

The marangoni dryer 23 containing the dried semiconductor wafers 3 is moved upward and unloaded onto an unloader 15 using the fourth rail 25b. The unloaded semiconductor wafers 3 are loaded into an empty cassette using the second moving mechanism 11a through 11c and the first moving mechanism 9a and 9b, thereby completing cleaning and drying of the semiconductor wafers.

Figure 12A:
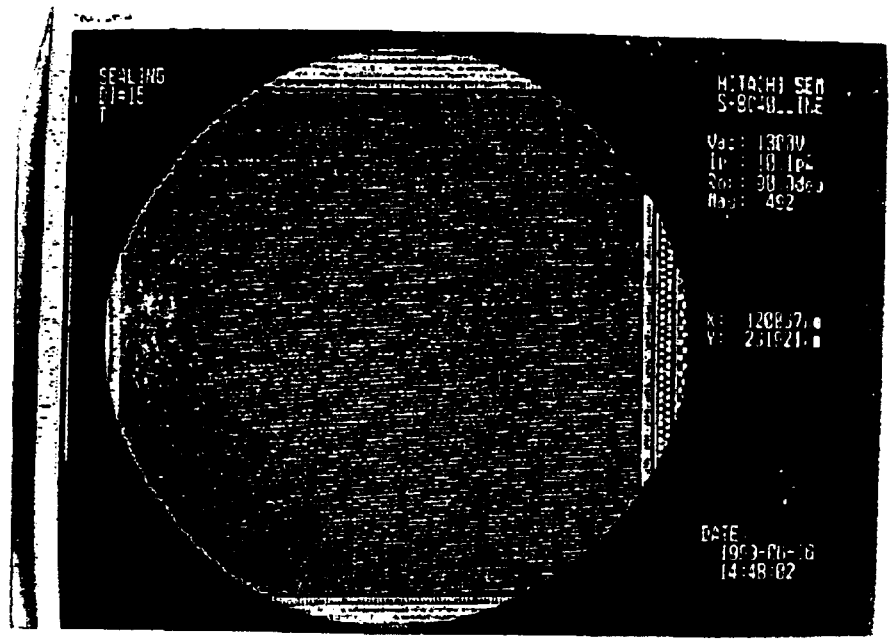
FIGS. 12A and 12B are scanning electron microscope (SEM) photographs of the surface of the semiconductor wafers illustrating two cases—a case where the semiconductor wafers are cleaned by a cleaning apparatus including a marangoni dryer according to the present invention, and a case where the semiconductor wafers are not cleaned by a cleaning apparatus in which a marangoni dryer is tightly sealed to an inner bath according to the present invention.
Figure 12B:
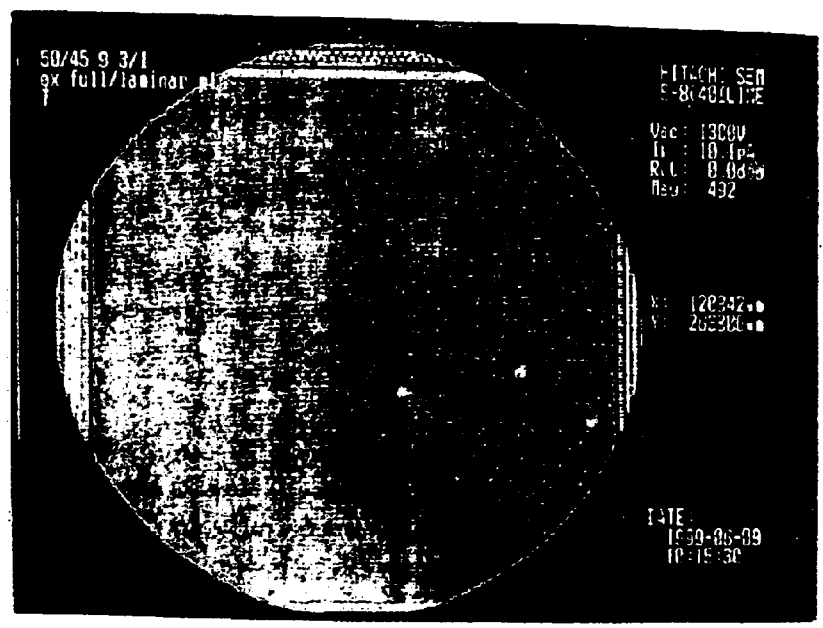

FIGS. 12A and 12B are photos taken by a scanning electron microscope (SEM) of the surface of the semiconductor wafers illustrating two cases, that is, a case in which the semiconductor wafers are cleaned by a cleaning apparatus including the marangoni dryer according to the present invention, and a case in which the semiconductor wafers are not cleaned according to the present invention. Specifically, FIG. 12A illustrates a case in which the semiconductor wafers are dried in a state where the marangoni dryer is closely adhered to the inner bath, after cleaning with de-ionized water, and FIG. 12B illustrates a case where the semiconductor wafers are dried in a state where the marangoni dryer is not closely adhered to the inner bath after the de-ionized water is cleaned. As shown in FIG. 12A, if the marangoni dryer is closely adhered to the bath, water marks do not occur on the surface of the semiconductor wafers. However, as shown in FIG. 12B, when the marangoni dryer is not closely adhered to the bath, water marks occur on the surface of the semiconductor wafers.

As described above, the marangoni dryer can move from the top of the inner bath in the ±X-, ±Y-, and ±Z-directions so that the semiconductor wafers can be dried in a state where the inner bath is closely adhered to the marangoni dryer. Exhaustion can be uniformly performed via the exhaust line of the outer baths 20 installed on both sides of the inner bath 19 during drying of the semiconductor wafers 3. Thus, the semiconductor wafer cleaning apparatus according to the present invention can dry the semiconductor wafers while uniformly performing exhaustion without being affected by laminar flow or exhaustion in the semiconductor wafer cleaning apparatus, thereby preventing the formation of water marks on the semiconductor wafers after drying. Also, the marangoni dryer of the semiconductor wafer cleaning apparatus can uniformly spray IPA vapor, thereby drying the semiconductor wafers more uniformly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor wafer cleaning apparatus comprising:
    a loading unit having a wafer cassette, said cassette being configured to support a plurality of semiconductor wafers horizontally as parallel to an X-Y plane;
    a first wafer moving mechanism movable along the direction of a Y-axis in said X-Y plane towards and away from said cassette to extract wafers from said cassette, said first wafer moving mechanism comprising a pad configured to support the wafers, and a revolving body to which said pad is connected, said revolving body being rotatable about an X-axis perpendicular to said Y-axis and also lying in said X-Y plane, whereby rotation of said revolving body about said X-axis from a first position to a second position elevates the wafers supported by said pad and orients the wafers vertically;
    an inner bath spaced apart from said loader along the direction of said X-axis, and in which the semiconductor wafers are cleaned with a cleaning solution;
    a marangoni dryer including a hood that is movable along the direction of said X-axis and vertically along the direction of a Z-axis that is orthogonal to said X- and Y- axes, said hood being supported above said inner bath, wherein downward movement of said hood along the direction of said Z-axis can bring said hood against the inner bath in a sealed engagement therewith, and upward movement of said hood along the direction of said Z-axis can space said hood vertically above said inner bath; and
    a knife that supports the semiconductor wafers loaded into the inner bath at a lower portion of the inner bath, and is movable along the direction of said Z-axis to raise and lower the semiconductor wafers supported thereon relative to said inner bath.

2. The semiconductor cleaning apparatus according to claim 1, and further comprising a loader interposed between said first wafer moving mechanism and said inner bath with respect to the direction of said X-axis and configured to support a plurality of semiconductor wafers as oriented vertically, and a second semiconductor wafer moving mechanism movable along the directions of said X- and Z-axes between said first wafer moving mechanism and said loader, said second semiconductor wafer moving mechanism being operable to transfer wafers from said pad, while said pad is in said second position thereof, to said loader, and wherein said hood of the marangoni dryer is movable between said loader and said inner bath.

3. The semiconductor cleaning apparatus according to claim 2, wherein said loader includes a pusher that is configured to support the semiconductor wafers as oriented vertically and is movable along the direction of said Z-axis so as to transfer wafers received from said second moving mechanism to said hood of the marangoni dryer.

4. The semiconductor cleaning apparatus according to claim 2, wherein said second wafer moving mechanism includes a clutch capable of clutching said wafers, and rails extending longitudinally in the directions of said X- and Z-axes, respectively, said clutch being supported by said rails so as to be movable therealong.

5. The semiconductor cleaning apparatus according to claim 1, wherein said hood has slots extending vertically therein for accommodating a plurality of semiconductor wafers, respectively, and a locking mechanism operable to selectively lock a plurality of semiconductor wafers within said slots and release the wafers from the slots.

6. The semiconductor cleaning apparatus according to claim 2, wherein said hood has slots extending vertically therein for accommodating a plurality of semiconductor wafers, respectively, and a locking mechanism operable to selectively lock a plurality of semiconductor wafers within said slots and release the wafers from the slots.

7. The semiconductor cleaning apparatus according to claim 3, wherein said hood has slots extending vertically therein for accommodating a plurality of semiconductor wafers, respectively, and a locking mechanism operable to selectively lock a plurality of semiconductor wafers within said slots and release the wafers from the slots.

8. The semiconductor cleaning apparatus according to claim 1, wherein said marangoni dryer comprises a drying solution supply plate disposed within said hood and having a plurality of holes, and a drying solution supply nozzle that supplies drying solution into said hood above said drying solution supply plate, whereby drying solution supplied by said drying solution supply nozzle is sprayed by said drying solution supply plate through the holes thereof.

9. The semiconductor cleaning apparatus according to claim 5, wherein said marangoni dryer comprises a drying solution supply plate disposed within said hood and having a plurality of holes, and a drying solution supply nozzle that supplies drying solution into said hood above said drying solution supply plate, whereby drying solution supplied by said drying solution supply nozzle is sprayed by said drying solution supply plate through the boles thereof.

10. The semiconductor cleaning apparatus according to claim 1, and further comprising outer baths disposed at opposite sides of the top of said inner bath, respectively, and wherein said inner bath has recesses at opposite sides of the top thereof, said recesses opening into said outer baths, respectively, such that cleaning solution in said inner bath can flow through said recesses into said outer baths.

11. The semiconductor cleaning apparatus according to claim 10, and further comprising exhaust lines connected to said outer baths, respectively, whereby cleaning solution can be exhausted from said outer baths.

* * * * *